United States Patent [19]

Baldi

[11] Patent Number: 4,845,139

[45] Date of Patent: Jul. 4, 1989

[54] MASKED METAL DIFFUSION

[75] Inventor: Alfonso L. Baldi, Wynnewood, Pa.

[73] Assignee: Alloy Surfaces Company, Inc., Wilmington, Del.

[21] Appl. No.: 584,538

[22] Filed: Feb. 28, 1984

Related U.S. Application Data

[63] Continuation-in-part of Ser. No. 571,510, Jan. 17, 1984, Pat. No. 4,537,927, Ser. No. 538,541, Oct. 3, 1983, Ser. No. 507,174, Jun. 23, 1983, Pat. No. 4,694,036, Ser. No. 479,211, Mar. 28, 1983, Pat. No. 4,476,244, Ser. No. 398,030, Jul. 16, 1982, Pat. No. 4,467,016, Ser. No. 416,353, Jun. 2, 1982, abandoned, Ser. No. 359,212, Mar. 18, 1982, Pat. No. 4,443,557, Ser. No. 310,085, Oct. 9, 1981, Pat. No. 4,617,202, Ser. No. 281,405, Jul. 8, 1981, Pat. No. 4,708,913, Ser. No. 242,350, Mar. 10, 1981, Pat. No. 4,464,430, and Ser. No. 851,504, Nov. 14, 1977, abandoned.

[51] Int. Cl.$^4$ .............................................. C08L 3/08
[52] U.S. Cl. ................................... 524/407; 524/403; 524/406; 524/408; 524/413; 524/430; 524/435; 524/439; 524/440; 427/250; 427/252; 427/253; 427/383 D; 427/383.9
[58] Field of Search ............... 824/403, 406, 407, 408, 824/413, 435, 439, 440

[56] References Cited

U.S. PATENT DOCUMENTS

| | | | |
|---|---|---|---|
| 3,692,731 | 9/1972 | McAdow | 523/204 |
| 3,759,852 | 9/1973 | Bradley | 523/455 |
| 3,884,705 | 5/1975 | Blair | 524/406 |
| 3,904,555 | 9/1975 | Matsuda et al. | 523/457 |
| 4,128,522 | 12/1978 | Elam | 524/365 |
| 4,464,430 | 8/1984 | Baldi | 427/252 |

Primary Examiner—Lewis T. Jacobs
Attorney, Agent, or Firm—Connolly & Hutz

[57] ABSTRACT

Very good masking of pack diffusion aluminizing on any metal to keep portions from being diffusion coated, is effected by localized coating layers the lowest of which is inert or depletion-reducing masking powder that can have same composition as substrates, mixed with non-contaminating film-former such as acrylic resin. The upper coating layer or layers can be of non-contaminating particles like nickel or $Cr_2O_3$ that upon aluminizing or chromizing become coherently held together to form a secure sheath. Such sheath can also be used for holding localized diffusion-coating layer in place. Film-former can be dissolved in volatile solvent, preferably methyl chloroform, in which masking powder or sheath-forming powder is suspended. Chromizing can be performed before aluminizing for greater effects.

18 Claims, No Drawings

MASKED METAL DIFFUSION

This application is a continuation-in-part of Ser. Nos. 851,504 filed Nov. 14, 1977 and subsequently abandoned, 242,350 filed Mar. 10, 1981 (now U.S. Pat. No. 4,464,430 granted Aug. 7, 1984) 281,405 filed July 8, 1981, now U.S. Pat. No. 4,708,913, issued Nov. 24, 1987, 310,085 filed Oct. 9, 1981, now U.S. Pat. No. 4,617,202, issued Oct. 14, 1986, 359,212 filed Mar. 18, 1982 (now U.S. Pat. No. 4,443,557 granted Apr. 17, 1984), 416,353 filed June 2, 1982, now abandoned, 398,030 filed July 16, 1982 (now U.S. Pat. No. 4,467,016 granted Aug. 21, 1984), 479,211 filed Mar. 28, 1983, (now U.S. Pat. No. 4,476,244, issued Oct. 9, 1984), 507,174 filed June 23, 1983, now U.S. Pat. No. 4,694,036, issue Sept. 15, 1987, 538,541 filed Oct. 3, 1983, 571,510 filed Jan. 17, 1984, now U.S. Pat. No. 4,537,927, issued Aug. 27, 1985.

Some or all of the above are direct or indirect continuations-in-part of Ser. Nos. 614,834 filed Sept. 19, 1975, now U.S. Pat. No. 4,141,760 granted 2/27/79, 694,951 filed June 11, 1976, subsequently abandoned, 752,855 filed Dec. 21, 1976, now U.S. Pat. No. 4,208,453 granted 6/17/80, 809,189 filed June 23, 1977, now U.S. Pat. No. 4,308,160 granted 12/29/81, 238,500 filed Feb. 26, 1981, now U.S. Pat. No. 4,350,719 granted 9/21/82.

The present invention relates to the treatment of metals to change their chemical characteristics, and also to compositions and techniques for confining protective diffusion coatings to desired locations on workpieces such as jet engine components to be protected by the coatings.

The foregoing as well as further objects of the present invention will be more fully understood from the following description of several of its exemplifications.

As pointed out in the earlier applications, diffusion aluminizing of ferrous metals greatly improves their corrosion resistance, particularly when top coatings are applied over the diffusion coatings, and particularly for those ferrous surfaces containing at least 1% chromium. In some cases such diffusion aluminizing is best masked off from undesired portions of the surface of the workpiece being coated. Thus where the dimensional accuracy of a workpiece is of a high order, such as on the root of a rotor blade that is to be securely received in a socket, it is frequently impractical to permit aluminizing of that root because the added aluminum increases the root's dimensions. Such masking problems arise more frequently with the superalloy components in the hot section of a turbine engine, where aluminizing and chromizing is widely practiced. Chromizing also increases dimensions.

A particularly desirable masking technique according to the present invention, involves the coating of the portions to be masked with at least one layer of finely divided essentially inert material such as inert diluent, or inert diluent mixed with a small amount, not over about 15%, of a depletion-reducing masking material such as powdered chromium, and applying over that coating at least one stratum of finely divided non-contaminating solid particles that upon subjection to diffusion coating become coherently held together to form a secure masking sheath. To hold the layers in place beforehand, the foregoing solid particles are preferably suspended in a solution of a binder in a volatile solvent, using as a binder a resin that does not interfere with the diffusion coating or the masking, and is preferably driven off essentially completely by the high temperatures of the diffusion coating.

The sheath-forming layer or one or more of the strata which constitute this layer, preferably have $Cr_2O_3$, nickel or mixtures of these two, as the particles that become coherently united by the aluminizing. Neither of these materials contaminate superalloy or stainless steel workpieces inasmuch as only chromium or nickel can be introduced into the workpieces from these sources, and these two metals are already present in the workpieces. Chromium and nickel are also not considered contaminants for low alloy steels, particularly those ferrous alloys containing at least 1% chromium, Even iron and plain carbon steels are not adversely affected by a little chromium or nickel diffused into their surfaces.

The $Cr_2O_3$ and nickel particles, particularly the latter, are so actively effective to make the foregoing sheaths that they can be diluted with as much as twice their weight of alumina or other inert filler, without losing their sheath-forming ability. While they can be used in undiluted form, it is preferred to dilute these ingredients with some filler, at least about half as much filler as active material, by weight. Such dilution diminishes the amount of material that can consume the diffusing metal, and also reduces the masking cost. Moreover undiluted coatings of $Cr_2O_3$ and resin tend to crack on drying.

For best masking of those aluminizing diffusions that are conducted at extremely high temperatures, e.g. 1900° F. or higher, it is helpful to have a three-layer masking combination in which the workpiece-contacting layer is of the depletion-reducing type, the next layer of the $Cr_2O_3$ type, and the outermost layer of the nickel type. The outermost two layers can be mixed together as a single combination layer, if desired. The presence of $Cr_2O_3$ in a layer such as the outermost layer imparts a characteristic greenish cast to that layer and this helps to vixually distinguish the fully prepared workpieces from those which are only coated with the depletion-reducing or lowermost masking layer.

A feature of the present invention is that the masking materials are conventiently marketed as a kit of chemicals. Such a kit can for instance of a container holding a quantity of depletion-reducing masking aluminide mixture of U.S. Pat. No. 3,801,357 for example, another container or two holding sheath-forming mixture or mixtures, a further container holding a solution of the resin in the volatile solvent, and if desired a still further container holding extra solvent. These kits enable very effective masking under all diffusion conditions, even at temperatures as low as 1100° F. or lower. Thus aluminum diffusion into some jet engine compressor parts is conducted at temperatures as low as 900° F., and can be masked in accordance with the present invention.

Turning now to a more detailed description of the present invention, the following is an example.

EXAMPLE 1

A number of hot section first stage jet engine blades made of B-1900 nickel-base superalloy had their roots dipped in the following mixture:

| | |
|---|---|
| Powdered $Ni_3Al$ having 20 to 100 micron particle size | 111 g. |
| Powdered chromium having 20 to 100 micron particle size | 3.4 g. |
| Powdered alumina having 20 to 100 | 111 g. |

-continued

| | |
|---|---|
| micron particle size | |
| Poly(ethylmethacrylate) | 9 g. |
| Methylchloroform | 123 g. |

The resin is first dissolved in the methyl chloroform, and the remaining ingredients then added with stirring to form a uniform suspension that does not settle very rapidly.

A single dip coating treatment with the suspension at room temperature, about 60° to about 80° F., deposits a layer weighing about 130 milligrams per square centimeter after the methyl chloroform solvent is permitted to evaporate. Only a fraction of a minute is needed to complete such a coating, and it is helpful to repeat the dip several times until the combined coatings weigh about 500 grams per square centimeter. Dipping a previously dipped coating in the dispersion does not remove any significant portion of the previous coating, particularly if the previous coating had been permitted to dry at room temperature for at least about ½ minute.

After three or more dips as above, the thus-coated blades are dipped in the following coating mixture:

| | |
|---|---|
| Powdered nickel, 20 to 100 micron particle size | 175 g. |
| Powdered alumina, 20 to 100 micron particle size | 175 g. |
| Poly(ethylmethacrylate) | 4.7 g. |
| Methyl chloroform | 62.1 g. |

This dipping is repeated two more times, with intervening dryings at least about ½ minute long each, to build up the latter coating to about 500 milligrams per square centimeter. The blades were then promptly inserted in a pre-fired diffusion aluminizing pack having the following composition in parts by weight.

| | |
|---|---|
| Powdered aluminum, 20 to 60 micron particle size | 10 |
| Powdered chromium, about 10 micron particle size | 40 |
| Powdered alumina, 20 to 60 micron particle size | 50 |
| Powdered NH$_4$Cl | 0.3 | into which additional NH$_4$Cl was blended to bring its concentration to the 0.3% value and make up for pre-firing volatilization. All of the blades were completely covered by the pack, and the mass was held in a diffusion coating retort. Diffusion coating was then carried out with a 6 hour hold at 1875° F. in the manner described in U.S. Pat. No. 3,785,854. The blades are then removed from the cooled retort and carry a hard shell-like sheath or crust where the roots had been covered with the masking dips. These crusts are quite adherent and coherent, so that the aluminizing pack is not materially contaminated by the masking layers, and can be reused for additional aluminizing without further precautions.

Co$_3$Al or Co$_2$Al or any of the other masking aluminides referred to in U.S. Pat. No. 3,801,357 can be used in place of the Ni$_3$Al in the foregoing example, with somewhat poorer results. Although the cobalt aluminide masking powders give better results with cobalt-based substrates, those results are still not as good as the results obtained from the nickel aluminides.

The crusts are fairly brittle and can be readily removed from the blades by light blows of a hammer or even a wood club, or by blasting with an air-propelled stream of nickel shot. The crust fragments are discarded leaving the blade roots showing no aluminizing, and the balance of the blades with a 3 mil aluminized case.

The shell or crust information of this example is due to the fact that the nickel powder in the outermost masking layer undergoes so much aluminizing that these powder particles grow together. The dilution of the nickel with as much as four-thirds its weight of inert material such as alumina does not prevent such growing together, and neither is it prevented by the presence of the resin in the dipped masking composition. Such resin is completely driven off during the initial portion of the diffusion coating heat, but the relatively small amount of such resin would not significantly affect the results even if it were to survive the diffusion heat or were carbonized by that heat.

The diluted Ni$_3$Al in the lower layers of masking does not become aluminized sufficiently to cause shell or crust formation, even though those layers also contain a small amount of chromium that by itself would form a shell. Any metal-containing layer in contact with a workpiece should contain at least 25% inert non-metal such as the alumina, or kaolin, to assure that the metal of the layer does not sinter to the workpiece, and such dilution also keeps the Ni$_3$Al from forming a shell or crust.

On the other hand, other aluminizable powders that are essentially inert to the workpiece but form shells, can be used in place of or in addition to the nickel powder in the shell-forming layers. Cr$_2$O$_3$ is another such shell-forming material, apparently undergoing some conversion to aluminized metallic chromium. Being less expensive than nickel, Cr$_2$O$_3$ is particularly desirable for use where masking expenses are to be minimized. Mixtures of nickel and Cr$_2$O$_3$ can be used with an effectiveness corresponding to that of each individually and indeed a small amount, such as 5% or even 25%, of Ni$_3$Al can be mixed with the nickel or the Cr$_2$O$_3$ without detracting significantly from the shell-forming results.

All diluents can be omitted from the shell-forming layers, if desired, but this makes it more important to be sure that at least the minimum effective amount of shell-forming layer is applied. In undiluted condition only about 100 milligrams per square centimeter of nickel or Cr$_2$O$_3$ is needed, and the presence of the resin adds an insignificant amount to the shell-forming layer needed. As noted, layers deposited from undiluted Cr$_2$O$_3$ suspended in a resin solution, tend to crack on drying, whereas there is no such cracking when the Cr$_2$O$_3$ is diluted with at least about ¼ its weight of Al$_2$O$_3$ or other diluent. When inert solid diluent such as alumina, resin or even Ni$_3$Al is used with nickel powder, such diluent is preferably not over about 50% by weight of the nickel is the sheath-forming layer. The resin content is preferably not over about 4% of the weight of the layer.

The resin in the outer layers acts to keep the masking layers from rubbing off onto or into the diffusion coating pack during the packing. Thus a stratum of nickel powder, with or without alumina, can be applied over the Ni$_3$Al-chromium-resin lower masking layers as by rotating the blades coated with those masking layers in a falling stream of powdered nickel so that falling powder particles adhere to the resin-containing lower masking layers. This is however not nearly as simple as the application of the outer masking layers by dipping, its uniformity is not as good, and some of the falling powder so adhered tends to rub off when the workpieces are handled and when the diffusion coating pack is poured over them.

After the first dip or two to apply resin-containing masking layers, some or all subsequent dips can be effected in resin-free suspensions of the coating materials in a solvent that dissolves the resin in the previously applied layers. Inasmuch as coating suspensions entirely free of resin are more difficult to maintain uniform, a little resin or other viscosity-increasing material can be added to such dispersions to reduce the settling rate of the dispersed powders.

It is also helpful to use a combination of shell-forming masking layers in which some are of the type that depend on the presence of nickel powder, and others are of the type that depend on the presence of $Cr_2O_3$ powder. Thus it is particularly desirable with aluminizings that are effected at about 2000° F. or higher, for the shell-forming combination of layers to have the lowermost shell-forming layer based on $Cr_2O_3$ and built up to at least about 300 milligrams per square centimeter, while the uppermost are based on nickel powder and are also built up to at least about 300 milligrams per square centimeter. It is not desirable for the $Cr_2O_3$ layers to be in contact with the substrate metal.

While other resins and solvents can be used to make the masking layers of the present invention, the acrylic resins are preferred and poly(ethylmethacrylate) is particularly preferred because it gives such good dip coatings and clean products. Methyl chloroform is also a particularly preferred solvent inasmuch as it has the desired solvent action combined with good evaporation characteristics and low use hazard. Some acrylic co-polymers are not sufficiently soluble in methyl chloroform, and for such polymers acetone or methyl ethyl ketone or methylene chloride or xylene or toluene or trichlorethylene can be used as the solvent or added to the methyl chloroform. Any other resin that forms a cohesive film can be used, even wax, so long as it does not contribute contamination as by silicon present in silicone resins.

For the masking it is very desirable to have a kit or package of the combination of masking materials. Thus an assembly of three containers can be packaged as a masking kit, one container having the depletion-reducing masking powder mixture of $Ni_3Al$ with chromium and inert diluent, a second container having the non-contaminating sheath-forming mixture, and the third container a solution of non-contaminating film-former in the volatile solvent. This solution preferably has a resin content of not over about 8%, and at least about 2%, by weight.

Where the quantity of film-former-solution is so large that this solution can be used over a period of time and can lose substantial amounts of its solvent by evaporation before all of the solution is used, the kit can be expanded to include a fourth container that holds fresh solvent with or without a little of the film-former.

Where two different kinds of sheath-forming mixtures are to be used, an extra container holding the second such mixture is added to the kit. The kit can thus have up to five different containers if no fresh solvent supply is included, or as many as six different containers if such supply is included.

As noted, the composition of the depletion-reducing masking mixture can vary in the manner described in U.S. Pat. No. 3,801,357. Thus the aluminide can be nickel or cobalt aluminide containing between ⅛ and ¾ atom of aluminum for every atom of nickel or cobalt, the inert particles can range from about ¼ to about ⅔ of this mixture by weight, and the chromium content can range from about ¼ to about 3% of this mixture by weight.

The foregoing masking is very effective to prevent the aluminizing of the masked surfaces. It also serves to mask against chromizing. The following example demonstrates a very effective chromizing combined with a masked aluminizing.

EXAMPLE 2

A batch of first stage PWA 1455 blades for the hot section of a jet engine are cleaned by degreasing in trichloroethylene and then lightly blasting with 220 grit alumina propelled by an air jet at 30 psig. The blades so cleaned are embedded in the following pack, all percentages being by weight

| | |
|---|---|
| Powdered chromium | 1.2% |
| Powdered nickel | 2.4% |
| Powdered aluminum | 0.37% |
| Powdered alumina | 96.03% |

All of the powders were minus 325 mesh, their particle sizes ranging from about 20 to about 50 microns, and the mixture well homogenized with repeated siftings, then further mixed with ½% $NH_4Cl$ and ½% $MgCl_2$ and placed in a chromized steel retort before the blades are packed. The packed retort was then covered by an outer retort as described and illustrated in U.S. Pat. No. 3,785,854, care being taken that the outer retort has no leaks and is well sealed. The atmosphere in the outer retort is displaced by a stream of argon introduced through an inlet conduit opening near the bottom of the interior of the outer retort and exited through an outlet conduit opening near the top of the interior of the outer retort. Heating of the retorts is initiated and the flow of argon maintained through the entire heat at a rate that assures essentially no entrance of air or moisture into the interior of the retorts. Where the outer retort has no leaks, an argon flow of about 5 standard cubic feet per hour is adequate.

The pack is held at 1900° and 1950° F. for 30 hours after which heating was terminated and the retorts permitted to cool, the argon stream being maintained. The retorts can be opened when the pack temperature cools to about 300° F., the blades unpacked, cleaned with a blast of air, and washed with water.

The blades have a very good chromized case 0.6 to 1.2 mils in depth, with no alphachrome and no objectionable oxide increase seen on metallographic examination.

The foregoing chromizing pack is used without a break-in heat, and has so little metal content that it can be discarded after a single use. If desired, its metal content can be salvaged as by pouring a stream of the used pack through a horizontally moving air stream which deflects away the lighter particles, permitting the metal particles to be collected.

The pack of Example 2 can be modified by incorporating in it about 0.1% magnesium. Chromized cases produced by a pack so modified have even less undesirable oxide visible on metallographic examination, and are of particularly high quality.

In general the pack of Example 2 can have a chromium content of from about 0.6 to about 2%, a nickel content from about ½ to about 3 times the chromium content, and an aluminum content about 1/10 to about ⅓ the chromium content. The argon atmosphere of that example can be replaced in whole or in part by helium, neon or other inert gas or mixtures thereof. Other inert diluents like kaolin can be substituted for the alumina in its pack.

The used diffusion coating packs of Example 2 contain a small amount of nickel-aluminum-chromium alloy and can be utilized as masking mixtures in low-temperature aluminizing, that is aluminizing conducted at not over about 1400° F. Thus the used pack can be mixed with 1/5 its weight of a 6% solution of poly(ethylacrylate) and the mixture applied by dipping over the roots of the blades chromized in Example 1, to build up a coating weighing 500 milligrams per square centimeter. The masked blades are then embedded in the following powder pack, the percentages being by weight

| | |
|---|---|
| Alumina | 85% |
| Aluminum-silicon alloy (88% Al) | 15% | to which is added ½% NH₄Cl.

A coating heat in hydrogen with a 30 minute hold at 1350° F. deposits a 10 milligram per square centimeter coating over all unmasked surfaces. The blades are then removed from the pack, the masking mixture brushed off, and then heated in hydrogen having a minus 35° F. dew point for 4 hours at 1975° F. to diffuse the aluminum coatings into the surfaces. They are then rapidly air cooled to below 1000° F., aged for 10 hours at 1600° to 1650° F., and again rapidly air cooled to give blades ready for use with roots only chromized and with their airfoil surfaces chromized and then aluminized.

The most elaborate masking arrangement of the present invention uses a three-layer masking combination in which the workpiece-contacting layer is of the essentially inert type, the next layer of the depletion-preventing type, and the outermost layer of the sheath-forming type. Nickel aluminides present in any masking layer other than a sheath-forming layer, should have no more than about 3 atoms of aluminum for every 4 atoms of nickel.

To make the masking layers easier to apply, it is helpful to add to the resin solution a little long-chain-hydrocarbon acid such as stearic acid that helps keep the particles of the masking composition dispersed in the volatilizable organic solvent in which they are suspended. As little as about 0.1% of such dispersing aid based on the total weight of the suspension, is enough to impart very good flowability so that the painting, or even dipping of the workpieces, is simpler and produces a more uniform masking layer. However dispersing aid concentrations of at least about 0.3% to about 0.5% are preferred, and as much as 1% can be effectively used.

Hydrocarbon chain lengths as short as 12 carbons and as long as 50 carbons or more are suitable for the dispersing aid. Thus lauric acid, myristic acid, oleic acid, and even copolymers of ethylene and acrylic acid, are effective. The dispersing aid should also be soluble in the solvent in which the masking composition is suspended, and hydrocarbon type solvents including halogenated hydrocarbons give best results.

The effectiveness of the dispersing aid is increased by also dissolving in the suspension a small amount of a surface-active agent, preferably a low-foaming non-ionic surface-active agent such as polyethoxy ether of a linear primary alcohol like cetyl alcohol, or of an alkyl phenol. Only about 0.1% of surface-active agent is all that is needed. It should be noted in this connection that the surface-active agent when added without the long-chain-hydrocarbon acid, has substantially no effect on the masking suspension.

The masking compositions of the present invention can be used to prevent chromizing or to prevent aluminizing. The nickel and/or nickel aluminide in the masking layers combines with either chromium or aluminum or both and in this way prevents significant penetration of either of these metals to the workpiece surface on which the masking is applied.

The essentially inert layer of the masking combination need only weigh about ⅛ gram per square centimeter to improve the masking action by preventing roughening of the workpiece surface being masked. That layer can also weigh as much as about 2 grams per square centimeter, and can be composed of inert materials such as alumina, kaolin or MgO. The presence of about ½ to about 5% chromium metal in the essentially inert layer or in the layer above it, contributes a strong depletion-reducing effect.

The following illustrates a more elaborate masking technique.

EXAMPLE 3

A group of hot section turbine engine blades of U-520 alloy (0.5% C, 19% Cr, 12% Co, 6% Mo, 1% W, 3% Ti, 2% Al, 0.005% B, the balance Ni) have their roots masked by dipped coating of three superimposed layers as follows:

first layer—a slurry of 2300 grams of 10 to 20 micron particles of alumina in 1300 grams (1000 cc) of a 7% solution of poly(ethylmethacrylate) in methyl chloroform containing 0.5% stearic acid. Three dips are used to provide a layer containing about 350 milligrams of non-volatiles per square centimeter of surface, and the layer is then permitted to dry by exposure to the atmosphere for about 20 seconds.

second layer—a slurry of 20 to 50 micron particles of Ni₃Al, similarly sized particles of Cr and 10 to 20 micron particles of alumina in the foregoing methyl chloroform solution of resin and stearic acid. The slurry contains 50 grams Ni₃Al, 5 grams Cr and 45 grams alumina for every 50 cc. of the foregoing solution, and two dips are used to provide about 400 milligrams of non-volatiles per square centimeter of surface. This layer is then permitted to dry.

third layer—a slurry of 20 to 50 micron particles of Ni, a similarly sized particles of Ni₃Al and 10 to 20 micron particles of alumina, suspended in the foregoing methyl chloroform solution of resin and stearic acid. The slurry contains 75 grams Ni, 13 grams Ni₃Al and 12 grams Al₂O₃ for every 33 cc. of the foregoing solution, and is brushed on to deposit a layer thickness containing about 600 milligrams of non-volatiles per square centimeter of surface. The resulting layer is also permitted to dry.

The slurries are shaken before dipping and before the brushes used for brushing are dipped into them. A little shaking keeps the slurries well dispersed for the few minutes needed to do the dipping or brushing, and each brush stroke applies a uniform slurry stratum that can be built up to the desired total layer thickness by an overlying brush stroke or two. Expert brush manipulation is not necessary.

The blades with the dried three-layer masking on their roots are then diffusion aluminized, and even at aluminizing temperatures as low as 1700° F. such combination forms the hard shell that remains in place and keeps the masking from significantly contaminating the surrounding diffusion-coating pack. The masking is in the form of a hard crack-free shell locked around each blade root. Striking this shell with a wooden mallet or rod breaks the shell into small pieces that do not adhere to the workpiece, and drop off revealing a smooth bright root surface free of diffusion coating. The balance of the blade shows a good diffusion case 4 mils deep.

Such hard shell protection is also formed when the first of the three masking layers, that is the essentially inert layer, is omitted, but the masked workpiece surface is then apt to be not quite as smooth and bright, particularly when the diffusion coating is effected at very high temperatures. With or without the essentially inert layer, at least about 50 milligrams of Ni$_3$Al or similar nickel aluminide per square centimeter of masked surface assures the most effective masking, and this can be applied with or without the metallic chromium, and with or without the alumina or other inert diluent in the masking layer. When used without the chromium and without the foregoing first layer, some loss of chromium takes place from masked superalloy surfaces. Without its inert diluent the masking layer becomes more expensive unless its thickness is reduced so that more care is needed to assure its proper application.

In general, a slurry used to apply a masking layer should have at least about 20 volume percent and up to about 70 volume percent suspended solids.

Some superalloys are adversely affected by slurry type masking layers when diffusion chromized at high temperatures for long times. Thus the masking combination of Example 3 will tend to cause intergranular attack of the U-520 during a chromizing heat and this tendency can be reduced by conducting the chromizing at temperatures below 1900° F.

For diffusion aluminizing at temperatures below about 1100° F. or diffusion chromizing at temperatures below 1800° F., masking is very effectively provided without the first layer and despite this omission does not cause significant roughening of the masked surface. When masking workpiece surfaces of cobalt or cobalt-base alloys, cobalt aluminides can be used in place of nickel aluminides. However the foregoing three-layer or two-layer masking is also effective when diffusion chromizing plain carbon and low alloy steels.

In general, the masking layer should contain powdered nickel or powdered nickel aluminide or powdered cobalt aluminide, preferably diluted so that it constitutes up to about 90% of the layer, and at least about 25% of the layer, by weight. However, for masking superalloys, where depletion is to be avoided, elemental nickel should not be used in a layer contacting the masked surface or having only an essentially inert layer between it and the masked surface.

Similarly a sheath-forming layer can have a nickel or Cr$_2$O$_3$ content of from about 50 to about 100%, and when it contains nickel can also separately contain aluminum in an amount up to equiatomic with the nickel.

The foregoing percentages do not take into account the resin bonding agent and the like that holds the layers in place but is driven off during the diffusion coating.

The second of the masking layers of Example 3 can be omitted and only the first and third layers used when masking against aluminizing and particularly when aluminizing stainless or low alloy steels.

The sheath-forming layer can be used as a very effective mask without any other helping layers, when aluminizing at temperatures below 1100° F. Sheath formation seems to be caused by the sintering together of the nickel particles in the third masking layer, under the influence of the diffusion atmosphere which causes diffusing metal to diffuse into the nickel of these particles. These particles thus grow in size. The Cr$_2$O$_3$ particles appear to form some chromium metal that becomes aluminized and sinters to a sheath.

Sheath formation is improved by adding to the sheath-forming layer a metal powder like aluminum the particles of which react with the nickel particles or with the Cr$_2$O$_3$ particles during the diffusion coating heat. Excessive addition is to be avoided to keep the added metal from contaminating the workpiece. Thus an aluminum addition of this type should contribute no more than about one atom of aluminum for every atom of nickel. As little as one one-hundredth of that proportion of aluminum helps the sheath formation, particularly where only a light diffusion is being performed.

The sheath-forming layer can be used to lock masking mixtures about a workpiece surface by partially or completely enveloping that surface. However such sheath formation will also securely hold a masking mixture against a portion of a flat or concave workpiece surface, particularly when such a combination is embedded in a powder pack in a diffusion coating retort.

Other inert diluents such as kaolin or MgO can be substituted for some or all the alumina in each of the foregoing formulations.

As noted, it is convenient to have a kit of masking materials for selective use as needed. Thus one such general utility kit contains separately packaged the inorganic ingredients or ingredient mixtures of the three masking layers of Example 3, along with a separate quantity of the methyl chloroform solution and a separate quantity of methyl chloroform make-up to replenish slurries that have lost excessive solvent through evaporation. The appropiate inorganic ingredients can then be selected and added to the methyl chloroform solution to make any or all of the foregoing layer-forming slurries.

A very desirable kit of this type has
(a) a quantity of diffusion-masking powder,
(b) a quantity of sheath-forming powder, and
(c) a solution of a binder in a volatile organic solvent, the quantities being so related that the sheath-forming powder is sufficient to form a continuous layer over a continuous layer of the diffusion-masking powder, and the solution forms a workable slurry with both powders.

Such a combination can have for example:
2000 grams of the diffusion-masking mixture of Ni$_3$Al, chromium and aluminum described for the first coating layer of Example 1;
3000 grams of the sheath-forming mixture of Ni, Ni$_3$Al and alumina described for the third layer of Example 3; and
one liter of the resin solution of Example 3.

For special situations, one or more of the foregoing ingredient units can be omitted from a kit.

The fragments of sheath broken away from the workpiece after the diffusion coating is completed, can contain large quantities of nickel, and such nickel can be recovered from the fragments, if desired, as by dissolving it out in acid and separating the dissolved nickel from dissolved aluminum by ammoniacal precipitation of the aluminum. Alternatively, the fragments can be crushed into powder, their inert diluent such as alumina separated from the crushed powder by dropping that powder through a horizontally moving airstream that deflects the less dense diluent more than the more dense metal, and melting the resulting metal with sufficient freshly added aluminum or nickel to convert the melt to $Ni_3Al$ for re-use as such.

Omitting the stearic acid from the slurries used to apply the masking layers makes it more difficult to keep the slurries uniformly suspended and calls for the slurries to be stirred or shaken frequently to reduce settling.

Using the first and/or second masking layers without the third layer leaves those lower layers in a condition in which they can contaminate a diffusion-coating pack in which they may be embedded.

Omitting the nickel from the outermost of the three layers keeps it from forming the desired protective shell, unless the omitted nickel is replaced by $Cr_2O_3$. The remaining ingredients of the outermost layer make it more generally effective and easier to apply, but are not essential.

Water can be used in place of or in addition to the volatilizable organic solvent in the foregoing slurries but is not preferred, even when used with a water-soluble or water-dispersible binder.

The substitution of other acrylic resins such as poly(ethylacrylate) or similar binder resins for the poly(ethylmethacrylate) of Example 3 does not materially change the results. Other solvents such as toluene can also be substituted for the methyl chloroform, but the methyl chloroform has a combination of non-flammability, volatility and lack of health hazard, that makes it particularly desirable.

The outermost or sheath-forming layer of the masking combination makes a very effective retaining or securing means that assures the locking of other types of layers beneath it onto the workpiece surface through the coating heat. The same securing action can be used to hold a slurry coating layer instead of a masking layer, on the workpiece. This is illustrated in the following example and makes it unnecessary to have the workpiece embedded in a coating pack.

EXAMPLE 4

A 5-foot length of steam generator high pressure tubing of Croloy alloy (1.9 to 2.6% Cr, 0.97 to 1.13% Mo, 0.15% C, balance essentially iron) having a ¾ inch bore and a ½ inch wall was thoroughly cleaned inside and out, and had its bore filled with a chromizing pack composed of a previously broken-in mixture of 10% chromium powder the particle sizes of which range from about 10 to about 20 microns, and
90% tabular alumina granules having a particle size ranging from about 100 to about 300 microns to which mixture was added ½% $NH_4Cl$ granules as an activator. The breaking-in was effected by a mixture of the foregoing three ingredients in a retort in the absence of a workpiece, to 1800°–1850° F. for 10 hours under hydrogen. The tube so filled had its ends capped with 1010 steel caps frictionally fitted over the tube ends so as to provide semi-gas-tight covers.

The outside surface of the tube was then painted with the following layers in succession, drying the first layer for a few minutes before applying the second:

first layer—600 grams of a previously broken-in mixture of 45% Cr, 45% alumina and 10% Al, to which ½% $NH_4Cl$ is added before as well as after break-in as described in U.S. Pat. No. 3,801,357, suspended in 200 cc of methyl chloroform solution containing 7 weight percent of a copolymer of 70% ethyl and 30% methyl methacrylates, 0.5 weight percent stearic acid and 0.1 weight percent cetyl ether of decaethoxy ethanol. Four applications of this mixture are made with intervening drying to build the non-volatile coating to 1200 milligrams per square centimeter of tube surface.

second layer—600 grams of a mixture of 68.5% Ni powder and 31.5% Al powder, dispersed in 150 cc of above methyl chloroform solution. The metals of this slurry were not pre-fired, and only two applications of this slurry was made to provide a non-volatile coating weight of about half that of the first layer.

The tube so prepared was placed in a tubular retort of a diffusion coating furnace assembly having inlet and outlet connections for a hydrogen-blanketing as in U.S. Pat. No. 3,801,357 and then subjected to a diffusion coating heat of 1800° F. for 10 hours. After cooldown at the end of the heat, the tube end caps were removed, the pack in the tube bore poured out, and the sheath around the exterior of the tube broken off and removed. The interior of the tube was effectively chromized with a case 1.8 to 2.3 mils thick, and the outside of the tube aluminized with a case about 24 mils thick.

The chromized case included an outer portion about 0.3 mil thick rich in chromium carbide, and an inner portion of columnar chromized structure. This is particularly effective in reducing erosion of the internal tube surface by rapidly moving high pressure steam.

The aluminized outer surface prolongs the life of the tube in a cool- or oil-fired furnace where it is subjected to combustion atmospheres at temperatures as high as about 1000° F.

The internal pack is a highly fluent composition that is easily poured into place before the heat, and is readily removed afterwards, using a minimum of mechanical poking and the like. Such a pack is particularly desirable for packing of cramped recesses in the interior of workpieces, such as in the narrow bores described above, or in hollow jet engine blades, or the like.

The noted fluency is brought about because the alumina granules, which are crushed from alumina which has been melted and solidified, are quite fluent and show a flow angle of about 45 degrees. This is the angle of incline (measured from the horizontal) of a cone made by pouring a stream of the granules onto one spot to build up the cone. The fluency can be increased by selecting aluminas or other inert particles having an even smaller flow angle. Thus alumina microspheres having particles sized about 100 to about 500 microns are exceptionally fluent. Tabular alumina, which can be made by sintering alumina powder and then crushing, is also fluent, and is preferred because it tamps in place better and then during the diffusion coating does not shrink from the surface against which it is tamped.

The pack need only have about ½ its volume of any of the foregoing fluent materials. Thus the chromium particles by themselves need not be fluent at all, and will provide a suitable fluent pack when ½ of the pack is constituted by the fluent granules or microspheres. Similarly non-fluent alumina or other non-fluent inert material can be present in the pack with or without non-fluent chromium powder, without detracting significantly from the fluency provided by the foregoing volume of fluent material.

Fluent packs are very helpful when the workpiece being coated has a portion of its surface masked to prevent coating there. For such masking the shell-forming masking materials are highly desirable, and the fluent coating pack in which the masked workpieces are embedded makes it easier to recover the masked workpiece at the completion of the coating operation with their masking intact. Little or no mechanical working of the fluent pack is needed to remove it from the retort and thus expose the masked workpieces. Thus a used fluent pack is readily removed from the interior of a narrow pipe, for instance, by pushing a narrower tube into the pipe bore and blowing air through the tube as it moves into that bore.

Fluent coating packs also do not require much tamping into place and this reduces the chances of disturbing the masking when the masked workpieces are loaded into a retort at the beginning of a coating operation.

The key feature of the improved masking is the application on the surface portion to be masked, of one or more layers of a masking mixture that inhibits depletion of important alloy ingredients from the substrate as a result of outward diffusion during the diffusion coating heat, and also forms a protective shell to secure the masking in place. The layer or layers are conveniently applied from a dispersion in a volatile solvent in which is dissolved a resin such as an acrylate that is driven off during the diffusion coating heat. The dispersion is very simply applied by brushing or dipping or even spraying and the volatile solvent, such as methyl chloroform, permitted to evaporate off for a few seconds to set the solids.

A very effective depletion-preventing slurry is essentially a mixture in the following proportions, of

| | |
|---|---|
| Ni$_3$Al powder | 40 to 60 grams |
| Cr powder | 4 to 6 grams |
| alumina powder | 40 to 60 grams | in 50 cc of a 5 to 10% by weight solution of poly(ethylmethacrylate) in methyl chloroform. The powders preferably have particle sizes no greater than about 50 microns, and any other inert powder, such as kaolin, can be used in place of the alumina. About 200 milligrams of non-volatiles per square centimeter are applied from a single dip or a single brushing in such a dispersion, and the dips or brushings repeated to build up the non-volatile weight to about 400 milligrams per square centimeter. For low temperature diffusion coating as with aluminum, the chromium content of the solids in the above slurry can be reduced and can be as low as 1% of all the solids.

The grey appearance of the foregoing mixtures as applied to the substrates, are sometimes difficult to visually distinguish on the substrate. Should it be desirable to make them stand out with more contrast, the mixture can be given some different color, as by substituting dark green $Cr_2O_3$ powder for some or all of the alumina. Substituting $Cr_2O_3$ for as little as one-twelfth of the alumina makes a distinct improvement in the distinguishability of the applied powder-resin layer.

Some aluminas are colored reddish and they can also be used for increasing the contrast in the appearance of the powder resin layer. If desired a little dye can be added to the dispersion for the same purpose. Where two or more different types of layers are built up to make a masking combination, each different type of layer can be given a different color to make them more readily distinguishable.

The fluent diffusion coating packs are also highly beneficial for use in chromizing bent small-bore tubing. Thus for some steam-generating arrangements lengths of steam-generating tubes have one end bent back 180 degrees to form cane-shaped units which can have their ends welded to additional lengths to form a continuous furnace tube assembly. The packing of the bores of such "canes" for diffusion coating, and the subsequent pack removal after coating, is greatly simplified by the use of fluent packs.

As pointed out, the shell-forming layer used to hold a slurry coating in place, contains non-contaminating materials that react and sinter together under coating conditions. Thus nickel and aluminum powders smaller than about 500 microns in size and in an atom proportion from about 1:0.9 to about 1:1.1 are very effective when in a sheath-forming layer covering a slurried aluminizing layer. Chromium can be substituted for the nickel in such a mixture. Because of the non-contaminating character, a diffusion coating pack will not be ruined in the event a small amount of the masking materials should inadvertently become mixed into it.

Masking of diffusion coatings can also be accomplished in other ways. Thus on ordinary irons and steels as well as low alloy steels, a localized layer of powdered iron appropriately diluted with inert diluent such as alumina, can be applied to reduce or prevent diffusion coating under the layer. This layer can be covered by a sheath-forming layer, but such covering is not needed where the workpieces are not roughly handled during treatment.

Such simple masking can be effected for example on chain saw cutter blades or other cutting edges that are subjected to substantial wear and it is desired to maintain cutting effectiveness notwithstanding the wear. On this basis the cutting edge can be in the form of a narrow edge face on a steel flange, one surface of the flange being very hard and the opposite surface of the flange being relatively soft. The edge face connects those two surfaces and is preferably tapered so that the edge of the harder surface projects out further than the edge of the softer surface, thus providing good cutting action. During use the edge face wears with the softer portion wearing faster than the harder portion so that the cutting effectiveness of the edge face is maintained quite well.

According to the present invention the cutter blades can be made of carbon steel and can be diffusion chromized on one surface to harden it. The opposite surface is masked as by the iron powder layer referred to above, slurrying it in a solution of a resin binder. Such a slurry can be readily applied, with a medicine dropper for example, to the desired surface of a small blade, and after such a coating layer sets the coated blade can be chromized to harden its uncoated surface.

For chromizing at low temperatures, such as 1300° to 1400° F., the masking layer need not contain any inert diluent, but at higher temperatures inert diluent such as alumina or kaolin will keep the iron powder from sintering to the cutters. A mixture of iron powder and alumina in which the alumina content is as high as 90% is suitable for masking a modest chromizing. This is illustrated in the following example.

EXAMPLE 5

A quantity of chain saw cutters made of high carbon steel having the formulation
0.65% carbon
0.3% manganese
0.75% nickel
0.5% chromium
0.15% molybdenum
balance essentially iron
are prepared by cleaning and then have their under surfaces individually coated with a slurry of a mixture of 80% alumina and 20% iron powder, suspended in a methyl chloroform solution of 2% poly (ethyl methacrylate) and 0.1% stearic acid. The coating weight of the dried coating is about 100 milligrams per square centimeter.

The resulting cutters are embedded in a chromizing mixture corresponding to that used for the internal chromizing in Example 4 but using non-fluent calcined 360 mesh alumina powder in place of the tabular alumina. The diffusion coating pack so made, held in a retort, is subjected to a diffusion coating heat as in Example 4, the pack being held at 1600° F. for five hours.

After cooldown, the retort is opened and the cutters removed and cleaned. A blast of fine glass particles propelled by stream of air from a 10 psig source removes the masking layers, and the resulting cutters have a 0.4 mil thick chromized case on the unmasked surfaces. The masked surfaces show much less chromizing as well as a greater degree of wear in use.

A fluent pack is not needed for such chromizing, but can be used if desired. Should portions of the masking layers break off during handling and remain in the coating pack, no significant harm is done inasmuch as such an iron-contaminated pack can still be very effectively reused to chromize ferrous surfaces.

To keep from decarburizing carbon away from the carbon steel being chromized, the chromized temperature can be kept from exceeding about 1850° F., and is preferably not over about 1750° F. Cutter blades made of type 416 stainless steel can also be treated in the foregoing manner with corresponding results.

The diffusion coating of nickel or DS nickel with chromium or aluminum can be correspondingly masked by a masking layer of nickel powder, preferably containing about 20 to about 90% inert diluent to keep it from sintering to the surface being masked. Other substrates can likewise be masked by a powdered masking layer having the same or essentially the same composition as the substrate. Some substrate ingredients such as carbon, silicon, manganese and aluminum generally do not have to be present in such masking layer to minimize loss of those ingredients from the substrate during a diffusion heat.

Instead of completely masking off a diffusion coating in selected locations, the diffusion can be arranged to form a thinner case in selected locations, as for example where dimensional tolerance is very tight. This is demonstrated in the following example.

EXAMPLE 6

Hollow first stage PWA 1422 blades for the hot section of a jet engine had their interiors and exteriors cleaned by the degreasing and blasting described in Example 2, and their interiors were then filled with the following powder pack mixture, all percentages being by weight:

| | |
|---|---|
| $Al_2O_3$ | 40% |
| Chromium | 45% |
| Aluminum | 15% | to which ½% NH₄Cl was added. All of the powders had particle sizes between about 20 and about 50 microns, and the mixture had been pre-fired with a previous addition of ½% NH₄Cl. The filling of the interiors was assisted by vibration of the blades.

Each blade then had its airfoil end embedded in a batch of the following powder pack mixture held in a short aluminized steel tube closely fitting the airfoil, as described in U.S. Pat. No. 3,824,122:

| | |
|---|---|
| $Al_2O_3$ | 75% |
| Chromium | 15% |
| Aluminum | 8.8% |
| Silicon | 1.2% | to which ½% NH₄Cl is added. This mixture had also been pre-fired to break it in with a previous addition of ½% NH₄Cl.

The collection of blade-holding tubes was then placed in a shallow aluminized retort, with the root of each blade pointing up, and that retort was then filled with the same powder pack used to fill the blade interiors, until all roots were covered by that pack. The retort so packed was then covered with an outer retort and subjected to a coating heat treatment in a hydrogen atmosphere with the temperature held at 1620° to 1700° F. for 6 to 7 hours. After cooldown the retort is unpacked, the blades removed and cleaned both internally and externally, and then given post heat treatment at 1980°–1990° F. for two hours. The final products showed 1 to 2.5 mil thick aluminized cases in their interiors and on their roots, with a 3 to 4.5 mil aluminized case on their airfoil surfaces. All coatings were of high quality.

The formulation for the two packs of this example can be varied as by a plus or minus departure from the above metal (including silicon) content figures, by an amount about ⅓ each figure. It is preferred however that the chromium-to-aluminum weight in the first pack be between 2.9 and 3.1.

Instead of positioning the airfoils in the closely-fitting individual tubes, the blade roots can be so positioned, and the individual tubes then packed with a masking powder, such as the following mixture:
42.3 weight % of $Al_2O_3$
36.9 weight % of Ni
5.6 weight % of Al
15.1 weight % of Cr.
U-520 blades so packed have their airfoil very effectively chromized in the following chromizing pack
45% chromium powder
23.5% nickel powder
3.6% aluminum powder 27.9% alumina powder This mixture is activated with ½% NH₄Cl and broken in by heating to 1950°-1975° F. for 12 hours without a workpiece. The broken in mixture is then finely divided, ½% NH₄Cl added again, and packed in with the blades and subjected to the diffusion-coating heat at 1950°-1975° F. for 10 hours. The masked roots pick up a measurable but very small coating. Also the masking powders contain sufficient nickel in excess of the aluminum, to react with the chromium in the chromizing surroundings to form a weakly coherent mass that does not contaminate the diffusion-coating pack. The chromium content of this masking mixture can be diminished, if desired, to as little as 5%, and such mixtures are very good for masking any superalloy.

When a carbon-containing binder is used to hold a masking mixture in place, it can sometimes leave a little extra carbon on the substrate surface covered by the masking mixture. While such carbon deposition is not significant in substrates that contain a substantial carbon content, such deposition can be reduced or completely eliminated for substrates that contain only a small carbon content or none at all. Thus nitrocellulose and bentonite are effective binders that leave behind little or no carbon. Nitrocellulose can thus be dissolved in nitrobenzene or nitromethane, and bentonite can be mixed with water, to each form binders to which the masking powders are added to make a masking slurry or mud.

The minimizing of carbon residue is particularly desirable when masking the so-called single crystal superalloy vanes and blades for the hot section of a jet engine. The foregoing binders that do not deposit any significant carbon are accordingly particularly suited to provide slurry coatings for masking such diffusion aluminizing or masking diffusion coatings with other metals.

For best results the single crystal superalloy workpieces are masked with binder-free masking mixtures. Also for such purposes the nickel and any other metal in such masking mixtures should be free of detectable carbon. In addition the breaking in of such a masking mixture should not expose it to significant quantities of carbon. Thus the retort used for the break-in is preferably a carbon-free or low carbon content metal.

Masking mixtures that rely on powdered nickel have strong surface-depletion tendencies, and substituting powdered iron for two-thirds the powdered nickel, by weight, sharply reduces those tendencies without significantly impairing the masking function. Such substitution for at least half the nickel is desirable. Thus a suitable low-depleting sheath-forming masking mixture is:

1000 grams powdered nickel
2000 grams powdered iron
2400 grams powdered alumina slurried in a 5% solution of paraffin wax in mineral spirits.

Pre-alloying the nickel with the iron, as by pre-firing the powdered solids with ½% by weight NH₄Cl in a hydrogen-bathed retort at 1800° F. for eight hours, further reduces the surface-depletion tendencies.

These nickel-iron mixtures or alloys can be used as a top masking layer over an inert lower layer of alumina at least 20 mils thick, for masking a chromizing or aluminizing that is conducted at temperatures up to 2100° F. However for diffusion temperatures below about 1200° F., no lower layer is needed. Without a lower layer it is preferred that the powdered nickel-iron mixture or alloy be diluted with sufficient alumina, magnesia or other inert refractory powder to hold the nickel-iron content to between about 10 and about 50% by weight. When used with a lower layer, the nickel-iron masking layer preferably has a nickel-iron content of at least 40% by weight, and need contain no diluent.

The masking compositions can also contain some metallic chromium, up to about 20% if desired, particularly when applied as a masking powder directly on workpieces made of stainless steel or other steels the surface of which contains a level of chromium, even as low as 0.5%, that should not be depleted. The presence of as much as 20% chromium in a chromium-nickel-iron or chromium-iron masking metal mixture will not prevent it from adequately masking against chromizing.

On such very effective mixture for masking stainless steels against chromizing is:

18% chromium
8% nickel
74% iron diluted with an equal volume of powdered Al₂O₃, pre-fired at 1900°-1950° F. for 12 hours under hydrogen after adding 1% NH₄Cl.

Another such masking mixture very effective against aluminizing is 12.9% chromium
8.6% nickel
7.1% iron
71.4% alumina pre-fired at 1750° F. for 10 hours under hydrogen, after adding ½% NH₄Cl.

The foregoing two mixtures can also be used without pre-firing, and either way produce sheaths that adhere to the workpieces on which they are applied with or without essentially inert lower layers.

The nickel-iron mixtures tend to cause a little diffusion of iron into a substrate on which these mixtures are applied. This effect has no real significance where the substrate surface already contains at least about 25% iron. For substrate surfaces containing less iron it is preferred to keep the iron content of the sheath-forming masking below 20% by weight, and even down to 10% by weight for substrate surfaces containing less than 1% iron.

Where the aluminized skin of a ferrous metal pipe or other workpiece has an aluminum content of about 20 atom percent or more, that aluminum content can be decreased by masking or leaching the aluminized surface with hot concentrated aqueous KOH or NaOH. This leaching treatment can be similar to that described in application Ser. No. 479,211 filed Mar. 28, 1983, now U.S. Pat. No. 4,476,244, issued Oct. 9, 1984. Such treatment is more severe than the relatively mild leaching described in U.S. Pat. No. 3,764,371, particularly where the aluminized workpiece is a stainless steel. Type 304 stainless steel aluminized to an aluminum pick-up of 0.5 milligram per square centimeter can thus have its surface aluminum content reduced to simplify welding.

A stainless steel workpiece can be provided with a catalytic pyrophoric surface, by first plating the stainless steel surface with nickel or iron, then aluminizing the plated surface, and finally leaching the aluminum out of the plating. Thus a one to two or even eight mils thick acid nickel electroplate on plain carbon steel or 304 stainless steel can be aluminized at 750° to 800° F. for twelve hours, as in U.S. Pat. No. 4,154,705, to provide an aluminum pick-up of 1.9 to 2 milligrams per square centimeter, after which the aluminized surface can be leached in hot 20% aqueous NaOH to reduce the pick-up to about 1.1 milligrams per square centimeter.

This leaves a stainless steel workpiece with a very active surface suited for a water-electrolyzing electrode, anode or cathode, with reduced over-voltage. It is also suitable for use as a fuel cell electrode, both anode and cathode. The active nickel surface becomes warm when first exposed to air, showing that it is pyrophorically reacting with the air. Its best cathodic electrolyzing effects are provided if kept from exposure to air or oxygen. These results are also obtained when the aluminizing is conducted at other temperatures and for other times and with other diffusion-coating packs. Similarly the nickel platings can be deposited by ion bombardment, gas plating or other techniques, and the stainless steel can be of any other type. The stainless steel support need not be more than about 10 mils thick, and can be a foil or screen.

The high diffusion temperatures suggested in U.S. Pat. No. 4,116,804 are not desirable for aluminizing a stainless steel supported thin nickel or iron layer, inasmuch as high diffusion temperatures tend to cause some of the chromium from the stainless steel to diffuse into the thin nickel or iron layer and lower its activity for electrolytic use. It is accordingly desirable to keep the diffusion temperature below 1100° F. and to limit the dwell time at diffusion temperature to prevent chromium from reaching the outer surface of the nickel or iron coating.

The nickel or iron top coating can be given a top flash plating of silver or platinum about 0.05 mil to about 0.5 mil thick, before the aluminizing. Such a flash coat of nickel over an iron-plated stainless steel is also helpful.

Similar flash coatings can be applied over the activated nickel or iron plated stainless steels after the activation is completed by aluminizing and leaching.

Even without the stainless steel backings, a self-supporting iron or nickel screen or foil having its surfaces activated as noted, with or without the flash top coatings, make very good fuel cell electrodes, much like the similar activated metals of British Specification No. 1,289,751.

A stainless steel backed activated nickel or iron plating also makes a good catalyst for NOX reduction as described in the above-noted Patent Application Ser. No. 479,211, particularly if the diffusion step has caused some of the chromium from the stainless steel to reach the surface of the plating.

The activation of an aluminized nickel surface by leaching with caustic, provides good activity when the leaching is more vigorous. Thus a nickel screen made of wires about 20 mils thick, after aluminizing at 850° F. for 12 hours can be leached for 1½ hours with a boiling solution of 200 grams HaOH in enough water to make 500 cc, to leave the nickel surface quite active.

Good results are also obtained by a final leaching in boiling 60% or even 70% aqueous NaOH for one hour. KOH can be substituted for some or all of the NaOH in any of the leachings without significantly affecting the resulting activation, as for electrolyzing water in which an alkali like NaOH is dissolved to increase its conductivity. Such activated anodes, however leached, are preferably dipped into dilute hydrogen peroxide after the leach is completed, with or without an intervening or subsequent rinse in hot or boiling water, or in acidulated water, as described in Ser. No. 359,212, now U.S. Pat. No. 4,443,557 issued Apr. 17, 1984.

In general the caustic leaching of aluminized metals like stainless steels should not be extended so as to remove much of the aluminum at the interface between the aluminized case and the metal core under it. Too much removal at that location can reduce the adhesion between the core and the leached case and cause the leached case to spall off. A 1.5 to 2 mil aluminized case applied on 430 stainless steel by powder pack diffusion below 1000° F. is thus preferably leached for not over about 1¾ hours when the leaching is effected at about 150° to about 190° F. with 10 to 30% caustic. Preferably such leaching is for about 1 to about 1½ hours, particularly for use as an NOX-reducing catalyst with $NH_3$ in furnace and internal combustion engine exhausts. Thinner cases should be leached for proportional times. Leaching at lower temperatures, e.g. at 90° F., can be extended to about three hours.

When leached aluminized stainless steel screening is used for NOX removal, better results are obtained with the greatest degree of leaching, but the aluminized case should not be completely leached through. Some of the activated stainless steel stratum may slough off during the leaching, but this does not detract materially from the NOX-reducing effectiveness so long as the case is not completely leached through.

While anhydrous $AlCl_3$ is a very effective energizer for diffusion aluminizing at temperatures below about 1400° F., its sensitivity to moisture makes its use awkward. It can be replaced by anhydrous water-insoluble $CrCl_3$, as disclosed in parent Ser. No. 538,541, but that replacement is very high-priced in the current market.

According to the present invention there is used as such energizer a basic chromic halide that has been pre-treated to drive off liberatable water and also pre-treated to render it at least slightly acid. Any of the basic chromic chlorides can be used, after mixing with ½ to 10% its weight of $AlCl_3$ and heating of the mixture at 700° F. for at least about 4 hours at atmospheric pressure. The mixture is preferably kept out of contact with air, as by keeping it covered during at least the first hour of heating with an inert atmosphere such as argon.

The heating temperature can vary from about 600° F. to about 900° F. Under subatmospheric pressures from about 100 to 600 millimeters of mercury, the total heating time can be reduced to as little as about 2 hours.

The minor addition of the $AlCl_3$ keeps the heated product from becoming excessively basic. The mixture loses considerable weight as a result of the heating, and little or no aluminum compound can be detected in it after the firing is completed. However the fired product makes a very effective aluminizing energizer. For example it can be incorporated in a low temperature diffusion aluminizing pack in a proportion of from about ¼% to about 2% to give excellent aluminized cases that cause little or none of the etching generally produced when $AlCl_3$ is the energizer. Moreover essentially none of the chromium transfers from the energizer to the aluminized case.

A preferred low-temperature energizer is made by a five-hour firing under argon at atmospheric pressure, of the basic chloride $Cr_5(OH)_6Cl_9 \cdot 12H_2O$ mixed with 1% $AlCl_3$ by weight. The resulting energizer can be used in place of the energizer in the aluminizing step of Example II in U.S. Pat. No. 3,948,687, or in similar low-temperature diffusion aluminizings where relatively pure or silicon-containing aluminum powder packs are used to aluminize workpieced embedded in them. Such pack aluminizings can be effected on any metallic workpiece including the steel foils and powders of Ser. No. 571,510, now U.S. Pat. No. 4,537,927, issued Aug. 27, 1985. It appears that some of the metallic aluminum solid or vapor present in a hot aluminizing mixture reacts with the hot chromium compound in the pretreated energizer to liberate aluminum halides that accelerate the diffusion coating onto the workpiece without calling for awkward handling or humidity-free storage of the diffusion-coating materials.

Instead of some or all of the AlCl₃ used in the pretreating of the basic chromium chloride, other active halides such as aluminum bromide and titanium trichloride can be substituted. Also basic chromium bromides and iodides can be substituted for some or all of the basic chromium chlorides.

The aluminizing with any of the above described energizers can be used with a subsequent leaching to prepare pyrophoric foils of the nickel or iron, as described above, and even to correspondingly prepare pyrophoric metal powder. Such pyrophoric powder can alternatively be prepared by leaching aluminum or zinc out of a crushed alloy of these metals with iron, nickel or the like. The resulting pyrophoricity can be used to trigger exothermic reactions to greatly increase the thermal output. Thus pyrophoric iron powder made from iron-aluminum alloy also containing as little as 2 to 6% boron, generates much more heat and reaches temperatures as high as 2000° F. Such powders can be mixed with other readily ignited materials of high heat output, as for example powdered magnesium, lithium, boron, aluminum, titanium, carbon, silicon, uranium—preferably depleted from U-235 separation, molybdenum, tungsten, tantalum, vanadium, thorium, zirconium, beryllium and osmium. The mixed powders can be held together with a small amount of binder or can be compressed into discs or the like, and should contain sufficient pyrophoric metal to heat all of the mixture to ignition, and at least about 50% by weight is preferred.

Such a pyrophoric powder or powder mixture can be used as a thermal decoy against heat-seeking missiles, as by projecting them into the air from a sealed container. They can for example be compressed or bonded into discs or rods and projected in that form. Such decoy materials can also be given radar chaff characteristics, as by inserting them into thin-walled aluminum or copper tubes about an inch long. A quantity of such powder having particles about 20 microns or less in size can be extruded with the help of a polyethylene or polystyrene binder into elongated rods about 7 to 15 mils thick, and the rods wrapped in a turn of aluminum foil ½ to 2 mils thick. The wrap can be held in place by the binder, using heat or solvent to cause it to adhere to the extruded rod or to a small overlap of the wrap. Cutting such a wrapped assembly into suitable lengths, preferably leaving the cut ends open so that air can get to the powder within the wrap, can complete the production, but care should be taken to conduct all of the steps while the powder is protected as by a film of water, from contact with oxygen.

Instead of or in addition to the open ends of the cut lengths, the wrap itself can be perforated to permit more ready access of air to the wrapped powder. On the other hand such access can be hindered by increasing the proportion of binder to powder, and/or by impregnating the powder particles with colloidal inert particles as described in Ser. No. 281,405, now U.S. Pat. No. 4,708,913, issued Nov. 24, 1987 or with slowly volatilized liquids as described in Ser. No. 571,510, now U.S. Pat. No. 4,537,927, issued Aug. 27, 1985.

Preformed tubes can also be used to hold the pyrophoric powder. Such tubes can be extruded and then have their wall thickness reduced as by chemical milling.

Obviously many modifications and variations of the present invention are possible in the light of the above teachings. It is therefore to be understood that within the scope of the appended claims the invention may be practiced otherwise than as specifically described.

What is claimed:

1. A kit of masking materials for diffusion coating with aluminum or chromium, the kit containing
    (a) a quantity of diffusion-masking powder that does not form a sheath during diffusion coating and contains inert refractory diluent that prevents sintering to the surface being masked
    (b) a quantity of powder that does form such a sheath, and does not contaminate the coating, and,
    (c) a solution of a binder in a volatile organic solvent, the quantities being separate and so related that the sheath-forming powder is sufficient to form a continuous layer over a continuous layer of the diffusion-masking powder, and the solution forms a workable slurry with both powders.

2. The kit of claim 1 in which the binder is essentially an acrylic resin.

3. The kit of claim 1 in which one of the powders includes a distinctive coloring ingredient that is essentially non-contaminating to the diffusion coating treatment but visually identifies that powder.

4. A sheath-forming mixture essentially of powdered nickel, a powdered refractory diluent inert to diffusion coating, and in an amount that keeps the powdered nickel from sintering to a metal substrate, and a solution in a chloroform solvent of a resin that is substantially completely driven off in a diffusion coating heat, the solution being in a proportion to make a slurry of the mixture.

5. The mixture of claim 4 in which the resin is an acrylic resin.

6. The mixture of claim 4 in which the solvent is essentially methyl chloroform.

7. A kit of masking materials for diffusion coating, the kit containing
    (a) a quantity of diffusion-masking powder that is essentially a mixture of Ni₃Al and inert diluent and does not form a sheath during diffusion coating,
    (b) a quantity of powder that does form such a sheath, and
    (c) a solution of a binder in a volatile organic solvent, the quantities being separate and so related that the sheath-forming powder is sufficient to form a continuous layer over a continuous layer of the diffusion-masking powder, and the solution forms a workable slurry with both powders.

8. A kit of masking materials for diffusion coating, the kit containing
    (a) a quantity of diffusion-masking powder that does not form a sheath during diffusion coating,
    (b) a quantity of powder that does form such a sheath and is essentially a mixture of nickel with an inert diluent, and
    (c) a solution of a binder in a volatile organic solvent, the quantities being separate and so related that the sheath-forming powder is sufficient to form a continuous layer over a continuous layer of the diffusion-masking powder, and the solution forms a workable slurry with both powders.

9. A kit of masking materials for diffusion coating, the kit containing (a) a quantity of diffusion-masking powder that does not form a sheath during diffusion coating, (b) a quantity of powder that does form such a sheath, and (c) a solution of a binder in essentially methyl chloroform, the quantities being separate and so related that the sheath-forming powder is sufficient to form a continuous layer over a continuous layer of the diffusion-masking powder, and the solution forms a workable slurry with both powders.

10. A masking composition for use in the diffusion coating of a metal workpiece to prevent the coating from being deposited on the masked portion, which composition consists essentially of a powdered masking aluminide, a powdered refractory diluent inert to diffusion coating and in an amount that prevents sintering of the aluminide to the workpiece, an organic binder that is driven off at diffusion coating temperatures, and a chloroform solvent in a proportion to make a slurry of the composition.

11. The composition of claim 10 in which the binder is poly(ethylmethacrylate).

12. The composition of claim 4 in which the mixture also includes a dispersing aid dissolved in the solvent in an amount that reduces the settling out of the nickel particles after they are placed in suspension.

13. The combination of claim 12 in which the dispersing aid is a long-chain hydrocarbon acid.

14. The combination of claim 13 in which the dispersing aid is a mixture of long-chain hydrocarbon acid and a surface-active agent.

15. A masking mixture for use in the diffusion coating of a metal workpiece, said mixture consisting essentially of a powdered material that blocks diffusion into a superalloy, a powdered refractory diluent inert to diffusion coating and in an amount that keeps the powder from sintering to the workpiece under diffusion coating condition, and a solution of a resin in a chloroform solvent, the resin being one that is driven off under diffusion coating condition, and the proportion of the solution being sufficient to form a slurry of the mixture.

16. The combination of claim 15 in which the powdered material is nickel or $Cr_2O_3$ or mixtures thereof.

17. A masking mixture for use in the diffusion coating of a metal workpiece, said mixture consisting essentially of powdered nickel, powdered $Cr_2O_3$, a powdered refractory diluent inert to diffusion coating and in an amount that keeps the metal powder from sintering to the workpiece under diffusion coating condition, and a solution of a resin in a volatile organic solvent, the resin being one that is driven off under diffusion coating condition, the proportion of the solution being sufficient to form a slurry of the mixture.

18. A sheath-forming mixture essentially of powdered nickel in which the powder particles are from about 20 to about 100 microns in size, a powdered refractory diluent inert to diffusion conditions and in an amount sufficient to keep the powdered nickel from sintering to a substrate, and a solution in a volatile solvent of a resin that is substantially completely driven off in a diffusion coating heat, the proportion of solvent being such as to make a slurry of the mixture.

* * * * *